United States Patent
Chen (10) Patent No.: US 7,483,495 B2
(45) Date of Patent: *Jan. 27, 2009

(54) LAYERED MODULATION FOR DIGITAL SIGNALS

(75) Inventor: Ernest C. Chen, San Pedro, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/653,517

(22) Filed: Jan. 16, 2007

(65) Prior Publication Data

US 2007/0116156 A1    May 24, 2007

Related U.S. Application Data

(63) Continuation of application No. 09/844,401, filed on Apr. 27, 2001, now Pat. No. 7,209,524.

(51) Int. Cl.
    H04L 27/04 (2006.01)
(52) U.S. Cl. ..................... 375/295; 375/324
(58) Field of Classification Search ......... 375/295, 375/265, 279, 281, 287, 298, 324, 341, 316, 375/332, 262
See application file for complete search history.

(56) References Cited

U.S. PATENT DOCUMENTS

| | | |
|---|---|---|
| 3,076,180 A | 1/1963 | Havens et al. |
| 3,383,598 A | 5/1968 | Sanders |
| 3,878,468 A | 4/1975 | Falconer et al. |
| 3,879,664 A | 4/1975 | Monsen |
| 3,974,449 A | 8/1976 | Falconer |
| 4,039,961 A | 8/1977 | Ishio et al. |
| 4,068,186 A | 1/1978 | Sato et al. |
| 4,213,095 A | 7/1980 | Falconer |
| 4,253,184 A | 2/1981 | Gitlin et al. |

(Continued)

FOREIGN PATENT DOCUMENTS

DE    3642213    12/1986

(Continued)

OTHER PUBLICATIONS

Palicot, J., Veillard, J.; "Possible Coding and Modulation Approaches to Improve Service Availability for Digital HDTV Satellite Broadcasting at 22 GHz"; IEEE Transactions on Consumer Electronics; vol. 39, Issue 3; Aug. 1993; pp. 660-667.

(Continued)

*Primary Examiner*—Emmanuel Bayard (57) ABSTRACT

Signals, systems and methods for transmitting and receiving layered modulation for digital signals are presented. A layered signal for transmitting data, comprises a first signal layer including a first carrier and first signal symbols for a first digital signal transmission and a second signal layer including a second carrier and second signal symbols for a second signal transmission disposed on the first signal layer, wherein the layered signal has the first carrier demodulated and first layer decoded to produce the first signal symbols for a first layer transport, the first signal symbols are remodulated and subtracted from the layered signal to produce the second signal layer, and the second signal layer has the second carrier demodulated and decoded to produce the second signal symbols for a second layer transport.

24 Claims, 6 Drawing Sheets

U.S. PATENT DOCUMENTS

| | | |
|---|---|---|
| 4,283,684 A | 8/1981 | Satoh |
| 4,384,355 A | 5/1983 | Werner |
| RE31,351 E | 8/1983 | Falconer |
| 4,416,015 A | 11/1983 | Gitlin |
| 4,422,175 A | 12/1983 | Bingham et al. |
| 4,484,337 A | 11/1984 | Leclert et al. |
| 4,500,984 A | 2/1985 | Shimbo et al. |
| 4,519,084 A | 5/1985 | Langseth |
| 4,594,725 A | 6/1986 | Desperben et al. |
| 4,628,507 A | 12/1986 | Otani |
| 4,637,017 A | 1/1987 | Assal et al. |
| 4,647,873 A | 3/1987 | Beckner et al. |
| 4,654,863 A | 3/1987 | Belfield et al. |
| 4,670,789 A | 6/1987 | Plume |
| 4,709,374 A | 11/1987 | Farrow |
| 4,800,573 A | 1/1989 | Cupo |
| 4,829,543 A | 5/1989 | Borth et al. |
| 4,835,790 A | 5/1989 | Yoshida et al. |
| 4,847,864 A | 7/1989 | Cupo |
| 4,860,315 A | 8/1989 | Hosoda et al. |
| 4,878,030 A | 10/1989 | Vincze |
| 4,896,369 A | 1/1990 | Adams et al. |
| 4,918,708 A | 4/1990 | Pottinger et al. |
| 4,993,047 A | 2/1991 | Moffatt et al. |
| 5,043,734 A | 8/1991 | Niho |
| 5,088,110 A | 2/1992 | Bonnerot et al. |
| 5,111,155 A | 5/1992 | Keate et al. |
| 5,121,414 A | 6/1992 | Levine et al. |
| 5,199,047 A | 3/1993 | Koch |
| 5,206,889 A | 4/1993 | Unkrich |
| 5,221,908 A | 6/1993 | Katz et al. |
| 5,229,765 A | 7/1993 | Gardner |
| 5,233,632 A | 8/1993 | Baum et al. |
| 5,237,292 A | 8/1993 | Chethik |
| 5,285,474 A | 2/1994 | Chow et al. |
| 5,285,480 A | 2/1994 | Chennakeshu et al. |
| 5,317,599 A | 5/1994 | Obata |
| 5,329,311 A | 7/1994 | Ward et al. |
| 5,337,014 A | 8/1994 | Najle et al. |
| 5,353,307 A | 10/1994 | Lester et al. |
| 5,412,325 A | 5/1995 | Meyers |
| 5,430,770 A | 7/1995 | Abbey |
| 5,450,623 A | 9/1995 | Yokoyama et al. |
| 5,467,197 A | 11/1995 | Hoff |
| 5,471,508 A | 11/1995 | Koslov |
| 5,493,307 A | 2/1996 | Tsujimoto |
| 5,513,215 A | 4/1996 | Marchetto et al. |
| 5,555,257 A | 9/1996 | Dent |
| 5,577,067 A | 11/1996 | Zimmerman |
| 5,577,087 A | 11/1996 | Furuya |
| 5,579,344 A | 11/1996 | Namekata |
| 5,581,229 A | 12/1996 | Hunt |
| 5,592,481 A | 1/1997 | Wiedeman et al. |
| 5,602,868 A | 2/1997 | Wilson |
| 5,603,084 A | 2/1997 | Henry, Jr. et al. |
| 5,606,286 A | 2/1997 | Bains |
| 5,608,331 A | 3/1997 | Newberg et al. |
| 5,625,640 A | 4/1997 | Palmer et al. |
| 5,642,358 A | 6/1997 | Dent |
| 5,644,592 A | 7/1997 | Divsalar et al. |
| 5,648,955 A | 7/1997 | Jensen et al. |
| 5,732,113 A | 3/1998 | Schmidl et al. |
| 5,793,818 A | 8/1998 | Claydon et al. |
| 5,815,531 A | 9/1998 | Dent |
| 5,819,157 A | 10/1998 | Ben-Efraim et al. |
| 5,828,710 A | 10/1998 | Beale |
| 5,848,060 A | 12/1998 | Dent |
| 5,870,439 A | 2/1999 | Ben-Efraim et al. |
| 5,870,443 A | 2/1999 | Rahnema |
| 5,937,004 A | 8/1999 | Fasulo et al. |
| 5,940,025 A | 8/1999 | Koehnke et al. |
| 5,940,750 A | 8/1999 | Wang |
| 5,946,625 A | 8/1999 | Hassan et al. |
| 5,952,834 A | 9/1999 | Buckley |
| 5,956,373 A | 9/1999 | Goldston et al. |
| 5,960,040 A | 9/1999 | Cai et al. |
| 5,963,845 A | 10/1999 | Floury et al. |
| 5,966,048 A | 10/1999 | Thompson |
| 5,966,186 A | 10/1999 | Shigihara et al. |
| 5,966,412 A | 10/1999 | Ramaswamy |
| 5,970,098 A | 10/1999 | Herzberg |
| 5,970,156 A | 10/1999 | Hummelgaard et al. |
| 5,970,429 A | 10/1999 | Martin |
| 5,978,652 A | 11/1999 | Burr et al. |
| 5,987,068 A | 11/1999 | Cassia et al. |
| 5,987,069 A | 11/1999 | Furukawa et al. |
| 5,995,832 A | 11/1999 | Mallinckrodt |
| 5,999,793 A | 12/1999 | Ben-Efraim et al. |
| 6,002,713 A | 12/1999 | Goldstein et al. |
| 6,008,692 A | 12/1999 | Escartin |
| 6,018,556 A | 1/2000 | Janesch et al. |
| 6,021,159 A | 2/2000 | Nakagawa |
| 6,028,894 A | 2/2000 | Oishi et al. |
| 6,032,026 A | 2/2000 | Seki et al. |
| 6,034,952 A | 3/2000 | Dohi et al. |
| 6,049,566 A | 4/2000 | Saunders et al. |
| 6,052,586 A | 4/2000 | Karabinis |
| 6,055,278 A | 4/2000 | Ho et al. |
| 6,061,393 A | 5/2000 | Tsui et al. |
| 6,072,841 A | 6/2000 | Rahnema |
| 6,078,645 A | 6/2000 | Cai et al. |
| 6,084,919 A | 7/2000 | Kleider et al. |
| 6,104,747 A | 8/2000 | Jalloul et al. |
| 6,108,374 A | 8/2000 | Balachandran et al. |
| 6,125,148 A | 9/2000 | Frodigh et al. |
| 6,125,260 A | 9/2000 | Wiedeman et al. |
| 6,128,357 A | 10/2000 | Lu et al. |
| 6,131,013 A | 10/2000 | Bergstrom et al. |
| 6,134,282 A | 10/2000 | Ben-Efraim et al. |
| 6,140,809 A | 10/2000 | Doi |
| 6,141,534 A | 10/2000 | Snell et al. |
| 6,144,708 A | 11/2000 | Maruyama |
| 6,166,601 A | 12/2000 | Shalom et al. |
| 6,177,836 B1 | 1/2001 | Young et al. |
| 6,178,158 B1 | 1/2001 | Suzuki et al. |
| 6,188,717 B1 | 2/2001 | Kaiser et al. |
| 6,192,088 B1 | 2/2001 | Aman et al. |
| 6,212,360 B1 * | 4/2001 | Fleming et al. ............ 455/13.4 |
| 6,219,095 B1 * | 4/2001 | Zhang et al. ................ 348/192 |
| 6,246,717 B1 | 6/2001 | Chen et al. |
| 6,249,180 B1 | 6/2001 | Maalej et al. |
| 6,266,534 B1 | 7/2001 | Raith et al. |
| 6,272,679 B1 | 8/2001 | Norin |
| 6,275,678 B1 | 8/2001 | Bethscheider et al. |
| 6,297,691 B1 | 10/2001 | Anderson et al. |
| 6,304,594 B1 | 10/2001 | Salinger |
| 6,307,435 B1 | 10/2001 | Nguyen et al. |
| 6,313,885 B1 | 11/2001 | Patel et al. |
| 6,314,441 B1 | 11/2001 | Raghunath |
| 6,320,464 B1 | 11/2001 | Suzuki et al. |
| 6,320,919 B1 | 11/2001 | Khayrallah et al. |
| 6,325,332 B1 | 12/2001 | Cellier et al. |
| 6,330,336 B1 | 12/2001 | Kasama |
| 6,333,924 B1 | 12/2001 | Porcelli et al. |
| 6,335,951 B1 | 1/2002 | Cangiani et al. |
| 6,366,309 B1 | 4/2002 | Siegle |
| 6,369,648 B1 | 4/2002 | Kirkman |
| 6,377,116 B1 | 4/2002 | Mattsson et al. |
| 6,389,002 B1 | 5/2002 | Schilling |
| 6,411,659 B1 | 6/2002 | Liu et al. |
| 6,411,797 B1 | 6/2002 | Estinto |
| 6,426,822 B1 | 7/2002 | Winter et al. |
| 6,429,740 B1 | 8/2002 | Nguyen et al. |
| 6,433,835 B1 | 8/2002 | Hartson et al. |

| | | |
|---|---|---|
| 6,452,977 B1 | 9/2002 | Goldston et al. |
| 6,477,398 B1 | 11/2002 | Mills |
| 6,501,804 B1 | 12/2002 | Dietmar et al. |
| 6,515,713 B1 | 2/2003 | Nam |
| 6,522,683 B1 | 2/2003 | Smee et al. |
| 6,529,715 B1 | 3/2003 | Kitko et al. |
| 6,535,497 B1 | 3/2003 | Raith |
| 6,535,801 B1 | 3/2003 | Geier et al. |
| 6,574,235 B1 | 6/2003 | Arslan et al. |
| 6,597,750 B1 | 7/2003 | Knutson et al. |
| 6,657,978 B1 | 12/2003 | Millman |
| 6,661,761 B2 | 12/2003 | Hayami et al. |
| 6,678,336 B1 | 1/2004 | Katoh et al. |
| 6,700,442 B2 | 3/2004 | Ha |
| 6,718,184 B1 | 4/2004 | Aiken et al. |
| 6,731,700 B1 | 5/2004 | Yakhnich et al. |
| 6,745,050 B1 * | 6/2004 | Forsythe et al. ............. 455/561 |
| 6,754,872 B2 | 6/2004 | Zhang et al. |
| 6,772,182 B1 | 8/2004 | McDonald et al. |
| 6,775,521 B1 | 8/2004 | Chen |
| 6,795,496 B1 | 9/2004 | Soma et al. |
| 6,809,587 B2 | 10/2004 | Ghannouchi et al. |
| 6,892,068 B2 | 5/2005 | Karabinis et al. |
| 6,922,436 B1 | 7/2005 | Porat et al. |
| 6,922,439 B2 | 7/2005 | Yamaguchi et al. |
| 6,934,314 B2 | 8/2005 | Harles et al. |
| 6,947,741 B2 | 9/2005 | Beech et al. |
| 6,956,841 B1 | 10/2005 | Stahle et al. |
| 6,956,924 B2 | 10/2005 | Linsky et al. |
| 6,970,496 B1 | 11/2005 | Ben-Bassat et al. |
| 6,980,609 B1 | 12/2005 | Ahn |
| 6,990,627 B2 | 1/2006 | Uesugi et al. |
| 6,999,510 B2 | 2/2006 | Batruni |
| 7,041,406 B2 | 5/2006 | Schuler et al. |
| 7,073,116 B1 | 7/2006 | Settle et al. |
| 7,079,585 B1 | 7/2006 | Settle et al. |
| 7,154,958 B2 | 12/2006 | Dabak et al. |
| 7,161,931 B1 | 1/2007 | Li et al. |
| 7,173,981 B1 | 2/2007 | Chen et al. |
| 7,184,473 B2 | 2/2007 | Chen et al. |
| 7,209,524 B2 * | 4/2007 | Chen .......................... 375/295 |
| 7,230,992 B2 | 6/2007 | Walker et al. |
| 7,239,876 B2 | 7/2007 | Johnson et al. |
| 7,251,291 B1 | 7/2007 | Dubuc et al. |
| 7,263,119 B1 | 8/2007 | Hsu et al. |
| 2001/0012322 A1 | 8/2001 | Nagaoka et al. |
| 2001/0016926 A1 | 8/2001 | Riggle |
| 2001/0024479 A1 | 9/2001 | Samarasooriya |
| 2001/0055295 A1 | 12/2001 | Akiyama et al. |
| 2002/0006795 A1 | 1/2002 | Norin et al. |
| 2002/0009141 A1 | 1/2002 | Yamaguchi et al. |
| 2002/0051435 A1 | 5/2002 | Giallorenzi et al. |
| 2002/0071506 A1 | 6/2002 | Lindquist et al. |
| 2002/0082792 A1 | 6/2002 | Bourde et al. |
| 2002/0136327 A1 | 9/2002 | El-Gamall et al. |
| 2002/0154705 A1 | 10/2002 | Walton et al. |
| 2002/0158619 A1 | 10/2002 | Chen |
| 2002/0172296 A1 | 11/2002 | Pilcher |
| 2002/0176516 A1 | 11/2002 | Chen |
| 2002/0186761 A1 | 12/2002 | Corbaton et al. |
| 2003/0002471 A1 | 1/2003 | Crawford et al. |
| 2003/0043941 A1 | 3/2003 | Johnson et al. |
| 2003/0072385 A1 | 4/2003 | Dragonetti |
| 2003/0138037 A1 | 7/2003 | Kaku et al. |
| 2003/0138040 A1 | 7/2003 | Rouphael et al. |
| 2003/0147472 A1 | 8/2003 | Bach et al. |
| 2003/0171102 A1 | 9/2003 | Yang |
| 2003/0185310 A1 | 10/2003 | Ketchum et al. |
| 2003/0194022 A1 | 10/2003 | Hammons et al. |
| 2004/0013084 A1 | 1/2004 | Thomas et al. |
| 2004/0091059 A1 | 5/2004 | Chen |
| 2004/0110467 A1 | 6/2004 | Wang |
| 2004/0137863 A1 | 7/2004 | Walton et al. |
| 2004/0146014 A1 | 7/2004 | Hammons et al. |
| 2004/0146296 A1 | 7/2004 | Gerszberg et al. |
| 2004/0196935 A1 | 10/2004 | Nieto |
| 2005/0008100 A1 | 1/2005 | Chen |
| 2005/0037724 A1 * | 2/2005 | Walley et al. ............... 455/302 |
| 2006/0013333 A1 | 1/2006 | Chen |
| 2006/0022747 A1 | 2/2006 | Chen et al. |
| 2006/0045191 A1 | 3/2006 | Vasanth et al. |
| 2006/0056541 A1 | 3/2006 | Chen et al. |
| 2007/0011716 A1 | 1/2007 | Koslov et al. |
| 2007/0121718 A1 | 5/2007 | Wang et al. |

FOREIGN PATENT DOCUMENTS

| | | |
|---|---|---|
| EP | 0115218 | 8/1984 |
| EP | 0222076 | 8/1986 |
| EP | 0238822 | 9/1987 |
| EP | 0356096 | 2/1990 |
| EP | 0491668 A2 | 6/1992 |
| EP | 0874474 A2 | 10/1998 |
| EP | 0929164 | 7/1999 |
| EP | 1011245 | 6/2000 |
| EP | 1065854 | 1/2001 |
| EP | 1335512 | 8/2003 |
| FR | 2696295 | 4/1994 |
| FR | 2724522 | 3/1996 |
| JP | 2-005631 | 1/1990 |
| JP | 2-095033 | 4/1990 |
| JP | 03139027 | 6/1991 |
| JP | 5-041683 | 2/1993 |
| JP | 5-114878 | 5/1993 |
| JP | 5-252084 | 9/1993 |
| JP | 07-038615 | 2/1995 |
| JP | 2001-244832 | 9/2001 |
| JP | 2002118611 | 4/2002 |
| WO | WO 99/00957 | 1/1999 |
| WO | WO 99/20001 | 4/1999 |
| WO | WO 99/23718 | 5/1999 |
| WO | 0079708 | 12/2000 |
| WO | 0079753 A1 | 12/2000 |
| WO | 0113532 A1 | 2/2001 |
| WO | 2001 0019997 | 3/2001 |
| WO | WO 01/19013 | 3/2001 |
| WO | WO 01/39455 | 5/2001 |
| WO | WO 01/39456 | 5/2001 |
| WO | WO 01/80471 | 10/2001 |
| WO | WO 02/073817 | 9/2002 |
| WO | WO 03/105375 | 12/2003 |
| WO | WO 2005/074171 | 8/2005 |
| WO | WO 2005/086444 | 9/2005 |

OTHER PUBLICATIONS

U.S. Appl. No. 10/693,135, filed Oct. 24, 2003, Chen, Jun. 20, 2007.
U.S. Appl. No. 10/532,632, filed Apr. 25, 2003, Chen et al., Jul. 29, 2007.
The Authoritive Dictionary of IEEE Standards Terms; Seventh Edition, pp. 1047—definition of "signal".
Fang, T. et al.; "Fourth-Power Law Clock Recovery with Prefiltering", Proceedings of the International Conference on Communications (ICC), Geneva, May 23-26, 1993, New York, IEEE, vol. 3, May 23, 1993, pp. 811-815, XP010137089, ISBN:0-7803-0950-2, Section I, Introduction.
Janssen, G.J.M; Slimane, S.B.: "Performance of a Multiuser Detector for M-PSK Signals Based on Successive Cancellation", ICC 2001, 2001 IEEE International Conference on Communications, Conference Record, Helsinky, Finland, Jun. 11-14, 2001, XP010552960.
Slimane, S.B.; Janssen, G.J.M.: "Power Optimization of M-PSK Cochannel Signals for a Narrowband Multiuser Detector", 2001 IEEE Pacific Rim Conference on Communications, Computer and Signal Processing, Victoria, B.C., Canada, Aug. 26-28, 2001, XP010560334.
Soong, A.C.K.; Krzymien, W.A.: "Performance of a Reference Symbol Assisted Multistage Successive Interference Cancelling Receiver in a Multicell CDMA Wireless System", Conference Record, Communication Theory Mini-Conference GlobeCom '95, IEEE Singapore Nov. 13-17, 1995, XP010159490.

Arslan, H; Molnar, K: "Iterative Co-channel Interference Cancellation in Narrowband Mobile Radio Systems", Emerging Technologies Symposium: Broadband, Wireless Internet Access, 2000 IEEE Apr. 10-11, 2000, Piscataway, New Jersey, US, XP010538900.

Mazzini, Gianluca: "Power Division Multiple Access", Universal Personal Communications, 1998, ICUPC 1998, IEEE 1998, International Conference on Florence, Italy, Oct. 5-9, 1998, New York, NY, US, IEEE, US Oct. 5, 1998, pp. 543-546, XP010314962 ISBN: 0-7803-5106-1.

Saleh, A.A.M. et al.: "Adaptive Linearization of Power Amplifiers in Digital Radio Systems", Bell System Technical Journal, American Telephone and Telegraph Co., New York, US, vol. 62, No. 4, Part 1, Apr. 1, 1983 (1983-04-2001), pp. 1019-1033, XP00208354.

Ramchandran, Kannan et al.: Multiresolution Broadcast for Digital HDTV Using Joint Source/Channel Coding, IEEE, vol. 11, No. 1, Jan. 1993, pp. 6-22.

Meyr, Heinrich et al.; "Digital Communicatrion Receivers—Synchronization, Channel Estimation, and Signal Processing"; John Wiley & Sons, Inc.; 1998; pp. 212-213 and 217-218; XP 002364874.

Meyr, Heinrich et al.; "Digital Communication Receivers—Synchronization, Channel Estimation, and Signal Processing"; John Wiley & Sons, Inc.; 1998; pp. 610-612; XP 002364876.

Wolcott, Ted J. et al.; "Uplink-Noise Limited Satellite Channels"; IEEE 1995; pp. 717-721; XP-00580915.

Seskar, Ivan et al.; "Implementation Aspects for Successive Interface Cancellation in DS/CDMA Systems"; Wireless Networks; 1998; pp. 447-452.

Earth Station Technology; 1986; pp. 404-412; XP-002248387.

Chen, Ernest et al.; "DVB-S2 Backward-Compatible Modes: A Bridge Between the Present and the Future"; International Journal of Satellite Communications and Networking; vol. 22, Issue 3, pp. 341-365; published 2004 by John Wiley & Sons, Ltd.

Scott, R. P. et al.; Ultralow Phase Noise Ti:sapphire Laser Rivals 100 MHz Crystal Oscillator; Nov. 11-15, 2001; IEEE-Leos; pp. 1-2.

Combarel, L. et al.; HD-SAT Modems for the Satellite Broadcasting in the 20 GHz Frequency Band; IEEE Transactions on Consumer Electronics; vol. 41, Issue 4; Nov. 1995; pp. 991-999.

U.S. Appl. No. 10/519,375, filed Dec. 22, 2004, Ernest C. Chen, Non-final Communication dated Dec. 27, 2007.

U.S. Appl. No. 10/913,927, filed Aug. 5, 2004, Ernest C. Chen, Non-final Communication dated Dec. 11, 2007.

U.S. Appl. No. 11/619,173, filed Jan. 2, 2007, Ernest C. Chen, Non-final Communication dated Nov. 15, 2007.

U.S. Appl. No. 10/532,631, filed Apr. 25, 2005, Paul R. Anderson, Non-final Communication dated Nov. 19, 2007.

U.S. Appl. No. 10/691,032, filed Oct. 22, 2003, Weizheng Wang, Non-final Communication dated Nov. 16, 2007.

U.S. Appl. No. 10/519,322, filed Dec. 23, 2004, Ernest C. Chen, Notice of Allowance dated Dec. 11, 2007.

U.S. Appl. No. 10/532,619, filed Apr. 25, 2005, Ernest C. Chen, Notice of Allowance dated Dec. 26, 2007.

U.S. Appl. No. 11/603,776, filed Nov. 22, 2006, Ernest C. Chen, Notice of Allowance dated Jan. 2, 2008.

U.S. Appl. No. 10/692,539, filed Oct. 24, 2003, Ernest C. Chen, Non-final Communication dated May 31, 2007.

U.S. Appl. No. 10/692,539, filed Oct. 24, 2003, Ernest C. Chen, Notice of Allowance dated Sep. 20, 2007.

U.S. Appl. No. 10/532,632, filed Apr. 25, 2005, Ernest C. Chen, Notice of Allowance dated Jan. 7, 2008.

U.S. Appl. No. 10/692,491, filed Oct. 24, 2003, Ernest C. Chen, Sep. 6, 2007.

U.S. Appl. No. 11/603,776, filed Nov. 22, 2006, Chen et al., Aug. 29, 2007.

Arslan, Huseyin and Molnar, Karl; "Co-channel Interference Cancellation with Successive Cancellation in Narrowband TDMA Systems"; Wireless Communications and Networking Conference; 2000 IEEE; Sep. 23-28, 2000; Piscataway, New Jersey, USA; vol. 3; pp. 1070-1074; XP010532692; ISBN: 0-7803-6596-8.

Non-final Communication dated Mar. 3, 2008 in U.S. Appl. No. 11/656,662, filed Jan. 22, 2007 by Ernest C. Chen et al.

EPO Communication dated Mar. 11, 2008 in European counterpart Application No. 03777694.5 of corresponding U.S. Appl. No. 10/532,509, filed Oct. 17, 2003 by Ernest Chen et al., now issued as Patent No. 7,230,480.

EPO Communication dated Mar. 7, 2008 in European counterpart Application No. 03742393.6 of corresponding U.S. Appl. No. 10/519,375, filed Jul. 3, 2003 by Ernest Chen et al.

Non-final Office Communication dated Apr. 1, 2008 in U.S. Appl. No. 10/961,579, filed Oct. 8, 2004 filed by Ernest C. Chen.

Notice of Allowance dated May 6, 2008 in U.S. Appl. No. 10/532,631, filed Apr. 25, 2005 by Paul R. Anderson et al.

Non-final Office Action dated Apr. 30, 2008 in U.S. Appl. No. 10/962,346, filed Oct. 8, 2004 by Ernest Chen.

Notice of Allowance dated Apr. 30, 2008 in U.S. Appl. No. 11/603,776, filed Nov. 22, 2006 by Ernest Chen et al.

EPO Communication dated Apr. 4, 2008 in European counterpart Application No. 03757359.9 corresponding to U.S. Appl. No. 10/165,710, filed Jun. 7, 2002 by Ernest Chen.

Notice of Allowance dated Mar. 12, 2008 in U.S. Appl. No. 11/655,001, filed Jan. 18, 2007 by Weizheng Wang et al.

Japanese Office Action dated Mar. 4, 2008 in Japanese counterpart Application No. 2004-297297 corresponding to U.S. Appl. No. 10/962,346, filed Oct. 8, 2004 by Ernest Chen.

EPO Communication dated Feb. 26, 2008 in European counterpart Application No. 04256234.8 corresponding to U.S. Appl. No. 10/962,346, filed Oct. 8, 2004 by Ernest Chen.

EPO Communication dated Feb. 7, 2008 in European counterpart Application No. 03742400.9 and received from European representative on Feb. 14, 2008 and corresponding to U.S. Appl. No. 10/519,322, filed Dec. 23, 2004 by Ernest Chen et al.

Notice of Allowance dated May 8, 2008 in U.S. Appl. No. 11/619,173, filed Jan. 2, 2007 by Ernest Chen et al.

Notice of Allowance dated May 6, 2008 in U.S. Appl. No. 10/532,632, filed Apr. 25, 2005 by Ernest Chen et al.

Notice of Allowance dated Apr. 21, 2008 in U.S. Appl. No. 10/519,322, filed Dec. 23, 2004 by Ernest Chen et al.

Combarel, L. and Lavan, E.; "HD-SAT (Race 2075): HDTV Broadcasting over KA-Band Satellite, Cable and MMDS"; International Broadcasting Convention; 1994; pp. 633-640; XP006505143.

EPO Communication dated May 6, 2008 in European counterpart Application No. 03774848.0 corresponding to U.S. Appl. No. 10/532,582, filed Apr. 25, 2005 by Ernest C. Chen et al., now issued Feb. 6, 2007 as U.S. Patent No. 7,173,977.

EPO Communication dated May 6, 2008 in European counterpart Application No. 03777627.5 corresponding to U.S. Appl. No. 10/532,619, filed Apr. 25, 2005 by Ernest C. Chen.

Notice of Allowance dated May 22, 2008 in U.S. Appl. No. 10/532,619, filed Apr. 25, 2005 by Ernest C. Chen.

El-Gamal, Abbas and Cover, Thomas M.; "Multiple User Information Theory"; Proceedings of IEEE; vol. 68, No. 12; Dec. 1980; pp. 1466-1483; XP007904837.

Scalart, Pascal; Leclerc, Michel; Fortier, Paul; Huynh, Huu Tue; "Performance Analysis of a COFDM/FM In-band Digital Audio Broadcasting System"; IEEE Transactions on Broadcasting, IEEE Service Center; Piscataway, New Jersey, USA; vol. 43, No. 2; Jun. 1, 1997; pp. 191-198; XP011006070.

Arslan, Huseyin; Molnar, Karl; "Successive Cancellation of Adjacent Channel Signals in FDMA/TDMA Digital Mobile Radio Systems"; Vehicular Technology Conference; 48th IEEE VTC; Ottawa, Canada; May 18-21, 1998; New York, New York, USA; vol. 3; May 18, 1998; pp. 1720-1724; XP010288123.

European Search Report and Search Opinion dated Jun. 13, 2008 in European counterpart Application No. 07075745.5 corresponding to U.S. Appl. No. 09/844,401, filed Apr. 27, 2001 by Ernest Chen, now issued Apr. 24, 2007 as U.S. Patent No. 7,209,524.

Notice of Allowance dated Jun. 13, 2008 in U.S. Appl. No. 10/532,524, filed Apr. 25, 2005 by Ernest C. Chen et al.

Notice of Allowance dated Jun. 2, 2008 in U.S. Appl. No. 10/691,032, filed Oct. 22, 2003 by Weizheng Wang et al.

Notice of Allowance dated Jun. 2, 2008 in U.S. Appl. No. 10/693,135, filed Oct. 24, 2003 by Ernest C. Chen.

Canadian Office Action dated Jan. 22, 2008 in Canadian counterpart Application No. 2487817 corresponding to U.S. Appl. No. 10/165,710, filed Jun. 7, 2002 by Ernest C. Chen.

Canadian Office Action dated Jan. 23, 2008 in Canadian counterpart Application No. 2484313 corresponding to U.S. Appl. No. 10/962,346, filed Oct. 8, 2004 by Ernest C. Chen.

Canadian Office Action dated Feb. 5, 2008 in Canadian counterpart Application No. 2503530 corresponding to U.S. Appl. No. 10/532,632, filed Apr. 25, 2005 by Ernest C. Chen et al.

Canadian Office Action dated Feb. 27, 2008 in Canadian counterpart Application No. 2515167 corresponding to U.S. Appl. No. 10/913,927, filed Aug. 5, 2004 by Ernest C. Chen.

Canadian Office Action dated Apr. 22 2008 in Canadian counterpart Application No. 2502924 corresponding to U.S. Appl. No. 10/532,619, filed Apr. 25, 2005 by Ernest C. Chen.

Final Rejection dated Jun. 24, 2008 in U.S. Appl. No. 10/519,375, filed Dec. 22, 2004 by Ernest C. Chen et al.

Non-Final Office Action dated Jun. 17, 2008 in U.S. Appl. No. 10/913,927, filed Aug. 5, 2004 by Ernest C. Chen.

Canadian Office Action dated Aug. 5, 2008 in Canadian counterpart Application No. 2503532 corresponding to U.S. Appl. No. 10/532,509, filed Oct. 17, 2003 by Ernest C. Chen et al., now issued Jun. 12, 2007 as U.S. Patent No. 7,230,480.

Final Rejection dated Sep. 9, 2008 in U.S. Appl. No. 11/656,662, filed Jan. 22, 2007 by Ernest C. Chen et al.

EPO Summons to attend Oral Proceedings dated Jul. 18, 2008 in European counterpart Application No. 02728894.3 corresponding to U.S. Appl. No. 09/844,401, filed Apr. 27, 2001 by Ernest Chen, now issued Apr. 24, 2007 as U.S. Patent No. 7,209,524.

Taiwanese Office Action dated May 14, 2008 in Taiwan counterpart Application No. 092129629 corresponding to U.S. Appl. No. 10/532,631, filed Apr. 25, 2005 by Paul R. Anderson et al.

Chinese Office Action dated Aug. 22, 2008 in Chinese Application No. 200410100591.6, referencing Chinese Patent CN1285984A (corresponding to U.S. Patent No. 6,275,678 (Bethscheider et al.), which was cited by IDS on Mar. 8, 2007).

* cited by examiner

LAYERED MODULATION FOR DIGITAL SIGNALS

CROSS REFERENCE TO RELATED APPLICATIONS

This application is a continuation of prior U.S. patent application Ser. No. 09/844,401, entitled "LAYERED MODULATION FOR DIGITAL SIGNALS," by Ernest C. Chen, filed Apr. 27, 2001 now U.S. Pat. No. 7,209,524, which application is hereby incorporated by reference herein.

This application is related to the following applications:

application Ser. No. 10/165,710, entitled "SATELLITE TWTA ON-LINE NON-LINEARITY MEASUREMENT,", filed on Jun. 7, 2002, by Ernest C. Chen, which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/236,414, entitled "SIGNAL, INTERFERENCE AND NOISE POWER MEASUREMENT," filed on Sep. 6, 2002, by Ernest C. Chen and Chinh Tran, which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/693,135, entitled "LAYERED MODULATION FOR ATSC APPLICATIONS," filed on Oct. 24, 2003, by Ernest C. Chen, which claims benefit to Provisional Patent Application No. 60/421,327, filed Oct. 25, 2002 and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/913,927, entitled "CARRIER TO NOISE RATIO ESTIMATIONS FROM A RECEIVED SIGNAL," filed on Aug. 5, 2004, by Ernest C. Chen, which is a continuation in part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 11/619,173, entitled "PREPROCESSING SIGNAL LAYERS IN LAYERED MODULATION DIGITAL SIGNAL SYSTEM TO USE LEGACY RECEIVERS," filed Jan. 2, 2007, which is a continuation of application Ser. No. 10/068,039, entitled "PREPROCESSING SIGNAL LAYERS IN LAYERED MODULATION DIGITAL SIGNAL SYSTEM TO USE. LEGACY RECEIVERS," filed on Feb. 5, 2002 by Ernest C. Chen, Tiffany S. Furuya, Philip R. Hilmes, and Joseph Santoru now issued as U.S. Pat. No. 7,245,671, which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/693,421, entitled "FAST ACQUISITION OF TIMING AND CARRIER FREQUENCY FROM RECEIVED SIGNAL," filed on Oct. 24, 2003, by Ernest C. Chen, now issued as U.S. Pat. No. 7,151,807, which claims priority to priority Provisional Patent Application Ser. No. 60/421,292, filed Oct. 25, 2002, and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/692,491, entitled "ONLINE OUTPUT MULTIPLEXER FILTER MEASUREMENT," filed on Oct. 24, 2003, by Ernest C. Chen, which claims priority to Provisional Patent Application No. 60/421,290, filed Oct. 25, 2002, and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 11/603,776, entitled "DUAL LAYER SIGNAL PROCESSING IN A LAYERED MODULATION DIGITAL SIGNAL SYSTEM," filed on Nov. 22, 2006, by Ernest C. Chen, Tiffany S. Furuya, Philip R. Hilmes, and Joseph Santoru, which is a continuation of application Ser. No. 10/068,047, entitled "DUAL LAYER SIGNAL PROCESSING IN A LAYERED MODULATION DIGITAL SIGNAL SYSTEM," filed on Feb. 5, 2002, by Ernest C. Chen, Tiffany S. Furuya, Philip R. Hilmes, and Joseph Santoru, now issued as U.S. Pat. No. 7,173,981, which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

appplication Ser. No. 10/691,032, entitled "UNBLIND EQUALIZER ARCHITECTURE FOR DIGITAL COMMUNICATION SYSTEMS," filed on Oct. 22, 2003, by Weizheng W. Wang, Tung-Sheng Lin, Ernest C. Chen, and William C. Lindsey, which claims priority to Provisional Patent Application Ser. No. 60/421,329, filed Oct. 25, 2002, and which is a continuation-in-part of application Ser. No. 09/844,401 entitled "LAYERED MODULATION FOR DIGITAL SIGNALS," filed on Apr. 27, 2001, by Ernest C. Chen, now issued as U.S. Pat. No. 7,209,524;

application Ser. No. 10/962,346, entitled "COHERENT AVERAGING FOR MEASURING TRAVELING WAVE TUBE AMPLIFIER NONLINEARITY, " filed on Oct. 8, 2004, by Ernest C. Chen, which claims priority to Provisional Patent Application Ser. No. 60/510,368, filed Oct. 10, 2003, and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 11/655,001, entitled "AN OPTIMIZATION TECHNIQUE FOR LAYERED MODULATION," filed on Jan. 18, 2007, by Weizheng W. Wang, Guancai Zhou, Tung-Sheng Lin, Ernest C. Chen, Joseph Santoru, and William Lindsey, which claims priority to Provisional Patent Application No. 60/421,293, filed Oct. 25, 2002, and which is a continuation of application Ser. No. 10/693,140, entitled "OPTIMIZATION TECHNIQUE FOR LAYERED MODULATION," filed on Oct. 24, 2003, by Weizheng W. Wang, Guancai Zhou, Tung-Sheng Lin, Ernest C. Chen, Joseph Santoru, and William Lindsey, now issued as U.S. Pat. No. 7,184,489, which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 11/656,662, entitled "EQUALIZERS FOR LAYERED MODULATION AND OTHER SIGNALS," filed on Jan. 22, 2007, by Ernest C. Chen, Tung-Sheng Lin, Weizheng W. Wang, and William C. Lindsey, which claims priority to Provisional Patent Application No. 60/421,241, filed Oct. 25, 2002, and which is a continuation of application Ser. No. 10/691,133 entitled "EQUALIZERS FOR LAYERED MODULATED AND OTHER SIGNALS," filed on Oct. 22, 2003, by Ernest C. Chen, Tung-Sheng Lin, Weizheng W. Wang, and William C. Lindsey, now issued as U.S. Pat. No. 7,184,473, which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/961,579, entitled "EQUALIZATION FOR TWTA NONLINEARITY MEASUREMENT" filed on Oct. 8, 2004, by Ernest C. Chen, which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/532,632, entitled "LOWER COMPLEXITY LAYERED MODULATION SIGNAL PROCESSOR," filed on Apr. 25, 2005, by Ernest C. Chen, Weizheng W. Wang, Tung-Sheng Lin, Guangcai Zhou, and Joe Santoru, which is a National Stage Application of PCT US03/32264, filed Oct. 10, 2003, which claims priority to Provisional Patent Application No. 60/421,331, entitled "LOWER COMPLEXITY LAYERED MODULATION SIGNAL PROCESSOR," filed Oct. 25, 2002, by Ernest C. Chen, Weizheng W. Wang, Tung-Sheng Lin, Guangcai Zhou, and Joe Santoru, and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524 application Ser. No. 10/532,631, entitled "FEEDER LINK CONFIGURATIONS TO SUPPORT LAYERED MODULATION FOR DIGITAL SIGNA," filed on Apr. 25, 2005, by Paul R. Anderson, Joseph Santoru and Ernest C. Chen, which is a National Phase Application of PCT US03/33255, filed Oct. 20, 2003, which claim priority to Provisional Patent Application No. 60/421,328, entitled "FEEDER LINK CONFIGURATIONS TO SUPPORT LAYERED MODULATION FOR DIGITAL SIGNALS," filed Oct. 25, 2002, by Paul R. Anderson, Joseph Santoru and Ernest C. Chen, and which is a continuation-in-part of application Ser. No. 09/844,401, entitled "LAYERED MODULATION FOR DIGITAL SIGNALS," filed on Apr. 27, 2001,by Ernest C. Chen, now issued as U.S. Pat. No. 7,209,524;

application Ser. No. 10/532,619, entitled "MAXIMIZING POWER AND SPECTRAL EFFICIENCIES FOR LAYERED AND CONVENTIONAL MODULATIONS," filed on Apr. 25, 2005, by Ernest C. Chen, which is a National Phase Application of PCT Application US03/32800, filed Oct. 16, 2003. which claims priority to Provisional Patent Application No. 60/421,288, entitled "MAXIMIZING POWER AND SPECTRAL EFFICIENCIES FOR LAYERED AND CONVENTIONAL MODULATION," filed Oct. 25, 2002, by Ernest C. Chen and which is a continuation-in-part of application Ser. No. 09/844,401 entitled "LAYERED MODULATION FOR DIGITAL SIGNALS," filed on Apr. 27, 2001, by Ernest C. Chen, now issued as U.S. Pat. No. 7,209,524, application Ser. No. 10/532,524, entitled "AMPLITUDE AND PHASE MATCHING FOR LAYERED MODULATION RECEPTION," filed on Apr. 25, 2005, by Ernest C. Chen, Jeng-Hong Chen, Kenneth Shum, and Joungheon Oh, which is a National Phase Application of PCT Application US03/31199, filed Oct. 3, 2003, which claims priority to Provisional Patent Application No. 60/421,332, entitled "AMPLITUDE AND PHASE MATCHING FOR LAYERED MODULATION RECEPTION," filed Oct. 25, 2002, by Ernest C. Chen, Jeng-Hong Chen, Kenneth Shum, and Joungheon Oh, and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524, and also claims priority to;

application Ser. No. 10/532,582, entitled "METHOD AND APPARATUS FOR TAILORING CARRIER POWER REQUIREMENTS ACCORDING TO AVAILABILITY IN LAYERED MODULATION SYSTEMS," filed on Apr. 25, 2005, by Ernest C. Chen, Paul R. Anderson and Joseph Santoru, now issued as U.S. Pat. No. 7,173,977, which is a National Stage Application of PCT Application US03/32751, filed Oct. 15, 2003, which claims priority to Provisional Patent Application No. 60/421,333, entitled "METHOD AND APPARATUS FOR TAILORING CARRIER POWER REQUIREMENTS ACCORDING TO A AVAILABILITY IN LAYERED MODULATION SYSTEMS," filed Oct. 25, 2002, by Ernest C. Chen, Paul R. Anderson and Joseph Santoru, and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/532,509, entitled "ESTIMATING THE OPERATING POINT ON A NONLINEAR TRAVELING WAVE TUBE AMPLIFIER," filed on Apr. 25, 2005, by Ernest C. Chen and Shamik Maitra, now issued as U.S. Pat. No. 7,230,480, which is a National Stage Application of PCT Application US03/33130 filed Oct. 17, 2003, and which claims priority to Provisional Patent Application No. 60/421,289, entitled "ESTIMATING THE OPERATING POINT ON A NONLINEAR TRAVELING WAVE TUBE AMPLIFIER," filed Oct. 25, 2002, by Ernest C. Chen and Shamik Maitra, and which is a continuation-in-part of application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/519,322, entitled "IMPROVING HIERARCHICAL 8PSK PERFORMANCE," filed on Dec. 23, 2004 by Ernest C. Chen and Joseph Santoru, which is a National Stage Application of PCT US03/020862 filed Jul. 1, 2003, which claims priority to Provisional Patent Application No. 60/392,861, filed Jul. 1, 2002 and Provisional Patent Application No. 60/392,860, filed Jul. 1, 2002, and which is also related to application Ser. No. 09/844,401, entitled "LAYERED MODULATION FOR DIGITAL SIGNALS," filed on Apr. 27, 2001, by Ernest C. Chen, now issued as U.S. Pat. No. 7,209,524;

application Ser. No. 10/519,375, entitled "METHOD AND APPARATUS FOR LAYERED MODULATION," filed on Jul. 3, 2003, by Ernest C. Chen and Joseph Santoru, which is a National Stage Application of PCT US03/20847, filed Jul. 3, 2003, which claims priority to Provisional Patent Application No. 60/393,437 filed Jul. 3, 2002, and which is related to application Ser. No. 09/844,401, entitled "LAYERED MODULATION FOR DIGITAL SIGNALS," filed on Apr. 27, 2001, by Ernest C. Chen, now issued as U.S. Pat. No. 7,209,524 application Ser. No. 10/692,539, entitled "ON-LINE PHASE NOISE MEASUREMENT FOR LAYERED MODULATION", filed on Oct. 23, 2003, by Ernest C. Chen, which claims priority to Provisional Patent Application No. 60/421,291, filed Oct. 25, 2002.

BACKGROUND OF THE INVENTION

1. Field of the Invention

The present invention relates generally to systems for transmitting and receiving digital signals, and in particular, to systems for broadcasting and receiving layered modulation in digital signals.

2. Description of the Related Art

Digital signal communication systems have been used in various fields, including digital TV signal transmission, either terrestrial or satellite.

As the various digital signal communication systems and services evolve, there is a burgeoning demand for increased data throughput and added services. However, it is more difficult to implement either improvement in old systems and new services when it is necessary to replace existing legacy hardware, such as transmitters and receivers. New systems and services are advantaged when they can utilize existing legacy hardware. In the realm of wireless communications, this principle is further highlighted by the limited availability of electromagnetic spectrum. Thus, it is not possible (or at least not practical) to merely transmit enhanced or additional data at a new frequency.

The conventional method of increasing spectral capacity is to move to a higher-order modulation, such as from quadrature phase shift keying (QPSK) to eight phase shift keying (8PSK) or sixteen quadrature amplitude modulation (16QAM). Unfortunately, QPSK receivers cannot demodulate conventional 8PSK or 16QAM signals. As a result, legacy customers with QPSK receivers must upgrade their receivers in order to continue to receive any signals transmitted with an 8PSK or 16QAM modulation.

It is advantageous for systems and methods of transmitting signals to accommodate enhanced and increased data throughput without requiring additional frequency. In addition, it is advantageous for enhanced and increased throughput signals for new receivers to be compatible with legacy receivers. There is further an advantage for systems and methods which allow transmission signals to be upgraded from a source separate from the legacy transmitter.

The present invention obtains these advantages.

SUMMARY OF THE INVENTION

Signals, systems and methods for transmitting and receiving non-coherent layered modulation for digital signals are presented. For example, a layered signal for transmitting data, comprises a first signal layer including a first carrier and first signal symbols for a first digital signal transmission and a second signal layer including a second carrier and second signal symbols for a second signal transmission disposed on the first signal layer, wherein the layered signal has the first carrier demodulated and first layer decoded to produce the first signal symbols for a first layer transport, the first signal symbols are remodulated and subtracted from the layered signal to produce the second signal layer, and the second signal layer has the second carrier demodulated and decoded to produce the second signal symbols for a second layer transport.

A receiver of the invention receives the combined layered signal and demodulates it to produce the first carrier and a stable combined signal. The stable combined signal is decoded to produce first layer symbols which are provided to a first layer transport. The first layer symbols are also used to construct an idealized first layer signal. The idealized first layer signal is subtracted from the stable combined layered signal to produce the second layer signal. The second layer signal is demodulated, decoded and the output second layer symbols are provided to a second layer transport.

In the invention, a second (lower) layer of modulation is added to a first (upper) layer of modulation. Such an approach affords backwards-compatible implementation, i.e. legacy equipment can remain unchanged and continue to transmit and receive signals while new equipment may simultaneously transmit and receive enhanced signals. The addition of the second layer provides increased capacity and services to receivers that can process information from both layers. The upper and lower layer signals may be non-coherent; there is no required carrier phase relationship between the two signal layers.

Alternate embodiments may abandon backward compatibility with particular legacy equipment. However, layered modulation may still be used to provide expanded services with future system upgrades. Furthermore, as will be readily apparent to those skilled in the art, the principle of the invention may be extended to additional layers of modulation, with independent modulations, forward error correction (FEC) coding and code rates as the system may support in the future, while maintaining backward compatibility. The present invention provides many advantages.

For example, spectral efficiency may be significantly increased while maintaining backward compatibility with pre-existing receivers; if both layers use the same modulation with the same code rate, the spectral efficiency may be doubled. The present invention is more energy efficient and more bandwidth efficient than other backwards-compatible techniques using adapted 8PSK and 16QAM.

While it can achieve at least the spectral efficiency of a 16QAM modulation, the new modulation of the present invention does not require a linear traveling wave tube amplifier (TWTA) as with 16QAM. All layers may use QPSK or 8PSK, which are much more insensitive to TWTA nonlinearity. Also, by using QPSK modulation for all layers in the present invention, there is no additional performance penalty imposed on 8PSK or 16QAM due to carrier phase recovery error.

Also with the present invention, because the signals of different layers are non-coherent there is no required coordination in transmitting the separate layers. Therefore, the signal of a new layer may be transmitted from a different TWTA or even a different satellite. This allows implementation of the backward-compatible scheme at a later date, such as when a TWTA can output sufficient power to support multiple-layered modulations.

In addition, in typical embodiment the upper layers of the present invention are much more robust to rain fade. Only the lower layer is subject to the same rain fade as the current signal waveform does. As the legacy signal level is moved up in power, existing subscribers will experience far fewer service disruptions from rain fade.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which show, by way of illustration, several embodiments of the present invention. It is understood that other embodiments may be utilized and structural changes may be made without departing from the scope of the present invention.

Overview

The present invention provides for the modulation of signals at different power levels and advantageously for the signals to be non-coherent from each layer. In addition, independent modulation and coding of the signals may be performed. Backwards compatibility with legacy receivers, such as a quadrature phase shift keying (QPSK) receiver is enabled and new services are provided to new receivers. A typical new receiver of the present invention uses two demodulators and one remodulator as will be described in detail hereafter.

In a typical backwards-compatible embodiment of the present invention, the legacy QPSK signal is boosted in power to a higher transmission (and reception) level. This creates a power "room" in which a new lower layer signal may operate. The legacy receiver will not be able to distinguish the new lower layer signal, from additive white Gaussian noise, and thus operates in the usual manner. The optimum selection of the layer power levels is based on accommodating the legacy equipment, as well as the desired new throughput and services.

The new lower layer signal is provided with a sufficient carrier to thermal noise ratio to function properly. The new lower layer signal and the boosted legacy signal are non-coherent with respect to each other. Therefore, the new lower layer signal can be implemented from a different TWTA and even from a different satellite. The new lower layer signal format is also independent of the legacy format, e.g., it may be QPSK or 8PSK, using the conventional concatenated FEC code or using a new Turbo code. The lower layer signal may even be an analog signal.

The combined layered signal is demodulated and decoded by first demodulating the upper layer to remove the upper carrier. The stabilized layered signal may then have the upper layer FEC decoded and the output upper layer symbols communicated to the upper layer transport. The upper layer symbols are also employed in a remodulator, to generate an idealized upper layer signal. The idealized upper layer signal is then subtracted from the stable layered signal to reveal the lower layer signal. The lower layer signal is then demodulated and FEC decoded and communicated to the lower layer transport.

Signals, systems and methods using the present invention may be used to supplement a pre-existing transmission compatible with legacy receiving hardware in a backwards-compatible application or as part of a preplanned layered modulation architecture providing one or more additional layers at a present or at a later date.

Layered Signals

Figure 1A:
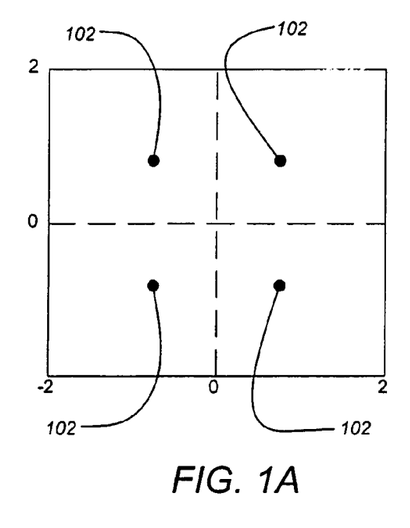
FIGS. 1A-1C illustrate the relationship of signal layers in a layered modulation transmission.
Figure 1B:
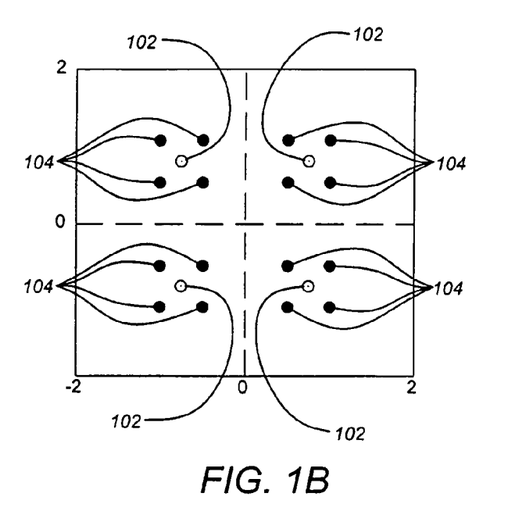
Figure 1C:
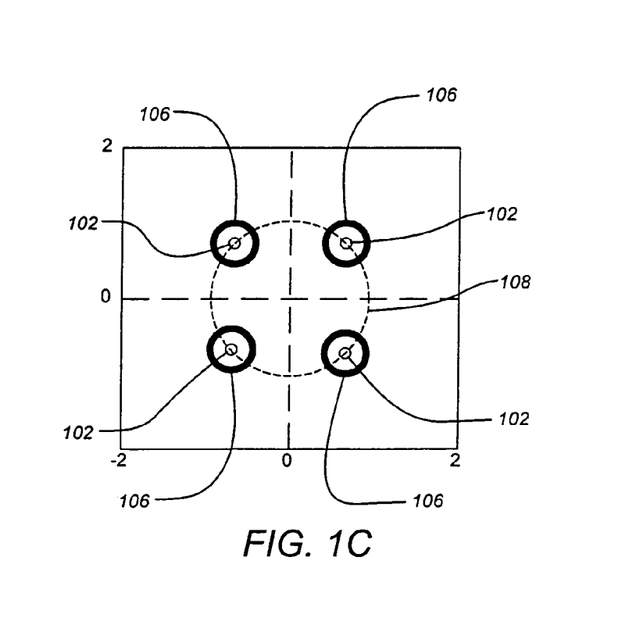

FIGS. 1A-1C illustrate the basic relationship of signal layers in a layered modulation transmission. FIG. 1A illustrates a first layer signal constellation 100 of a transmission signal showing the signal points or symbols 102. FIG. 1B illustrates the second layer signal constellation of symbols 104 over the first layer signal constellation 100 where the layers are coherent. FIG. 1C illustrates a second signal layer 106 of a second transmission layer over the first layer constellation where the layers may be non-coherent. The second layer 106 rotates about the first layer constellation 102 due to the relative modulating frequencies of the two layers in a non-coherent transmission. Both the first and second layers rotate about the origin due to the first layer modulation frequency as described by path 108.

Figure 2A:
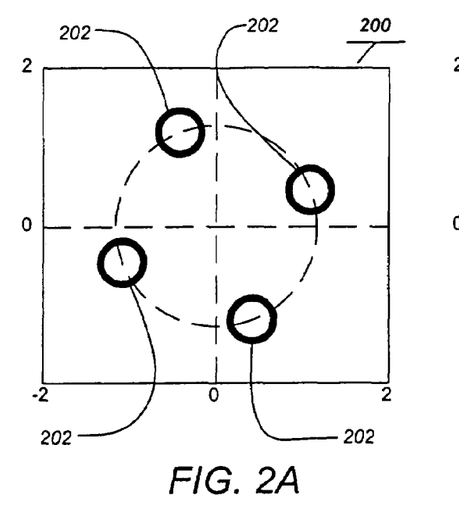
FIGS. 2A-2C illustrate a signal constellation of a second transmission layer over a first transmission layer non-coherently.
Figure 2B:
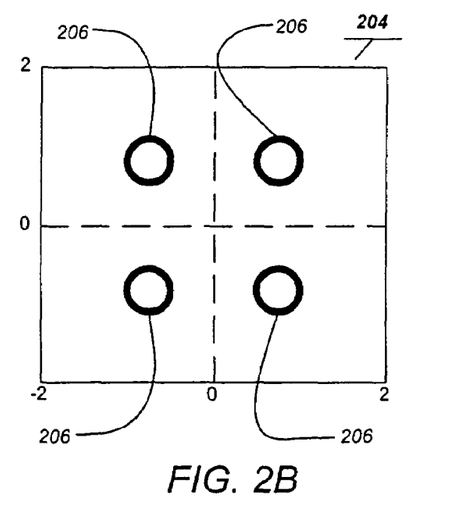
Figure 2C:
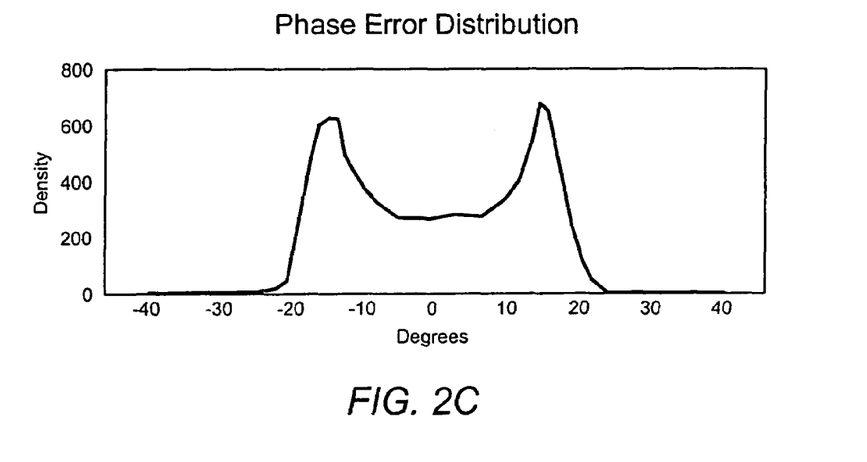

FIGS. 2A-2C illustrate a signal constellation of a second transmission layer over the first transmission layer after first layer demodulation. FIG. 2A shows the constellation 200 before the first carrier recovery loop (CRL) and FIG. 2B shows the constellation 200 after CRL. In this case, the signal points of the second layer are actually rings 202. FIG. 2C depicts a phase distribution of the received signal with respect to nodes 102. Relative modulating frequencies cause the second layer constellation to rotate around the nodes of the first layer constellation. After the second layer CRL this rotation is eliminated. The radius of the second layer constellation is determined by its power level. The thickness of the rings 202 is determined by the carrier to noise ratio (CNR) of the second layer. As the two layers are non-coherent, the second layer may also be used to transmit analog or digital signals.

Figure 3:
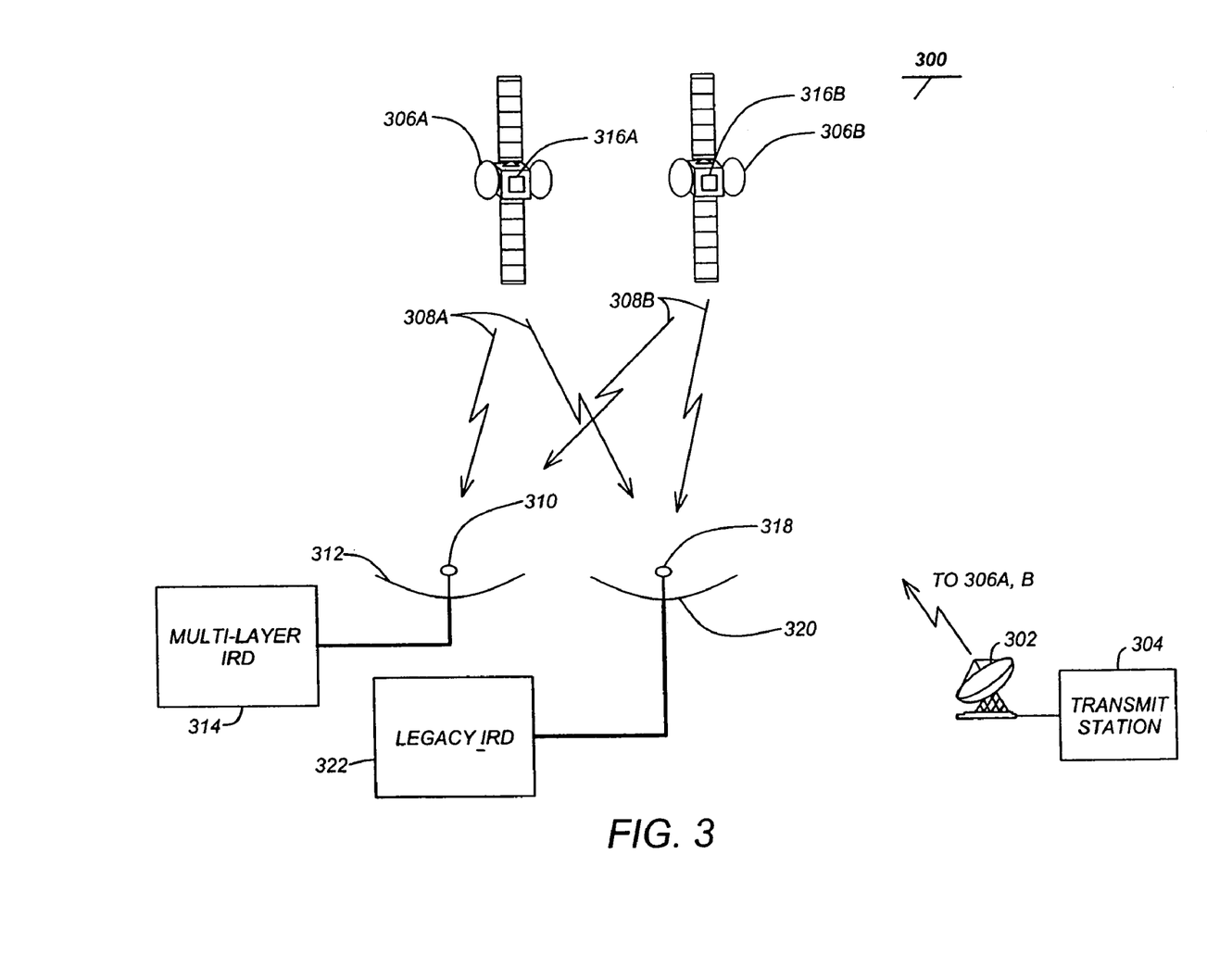
FIG. 3 is a block diagram for a typical system of the present invention.

FIG. 3 is a block diagram for a typical system 300 of the present invention. Separate transmitters 316A, 316B, as may be located on any suitable platform, such as satellites 306A, 306B, are used to non-coherently transmit different layers of a signal of the present invention. Uplink signals are typically transmitted to each satellite 306A, 306B from one or more transmit stations 304 via an antenna 302. The layered signals 308A, 308B (downlink signals) are received at receiver antennas 312, 320, such as satellite dishes, each with a low noise block (LNB) 310, 318 where they are then coupled to integrated receiver/decoders (IRDs) 314, 322. Because the signal layers may be transmitted non-coherently, separate transmission layers may be added at any time using different satellites 306A, 306B or other suitable platforms, such as ground based or high altitude platforms. Thus, any composite signal, including new additional signal layers will be backwards compatible with legacy receivers which will disregard the new signal layers. To ensure that the signals do not interfere, the combined signal and noise level for the lower layer must be at or below the allowed noise floor for the upper layer.

Hereafter the invention will be described in terms of particular applications which are backwards compatible and non-backwards compatible. "Backwards compatible" in this sense describes supplemental signal layers applied to systems previously implemented. In these applications, the pre-existing system architecture must be accommodated by the architecture of the additional signal layers. "Non-backwards compatible" describes a system architecture which makes use of layered modulation, but there is no pre-existing equipment.

The pre-existing legacy IRDs 322 decode and make use of data only from the layer (or layers) they were designed to receive, unaffected by the additional layers. However, as will be described hereafter, the legacy signals may be modified to optimally implement the new layers. The present invention may be applied to existing direct satellite services which are broadcast to individual users in order to enable additional features and services with new receivers without adversely affecting legacy receivers and without requiring additional signal frequency.

Demodulator and Decoder

Figure 4A:
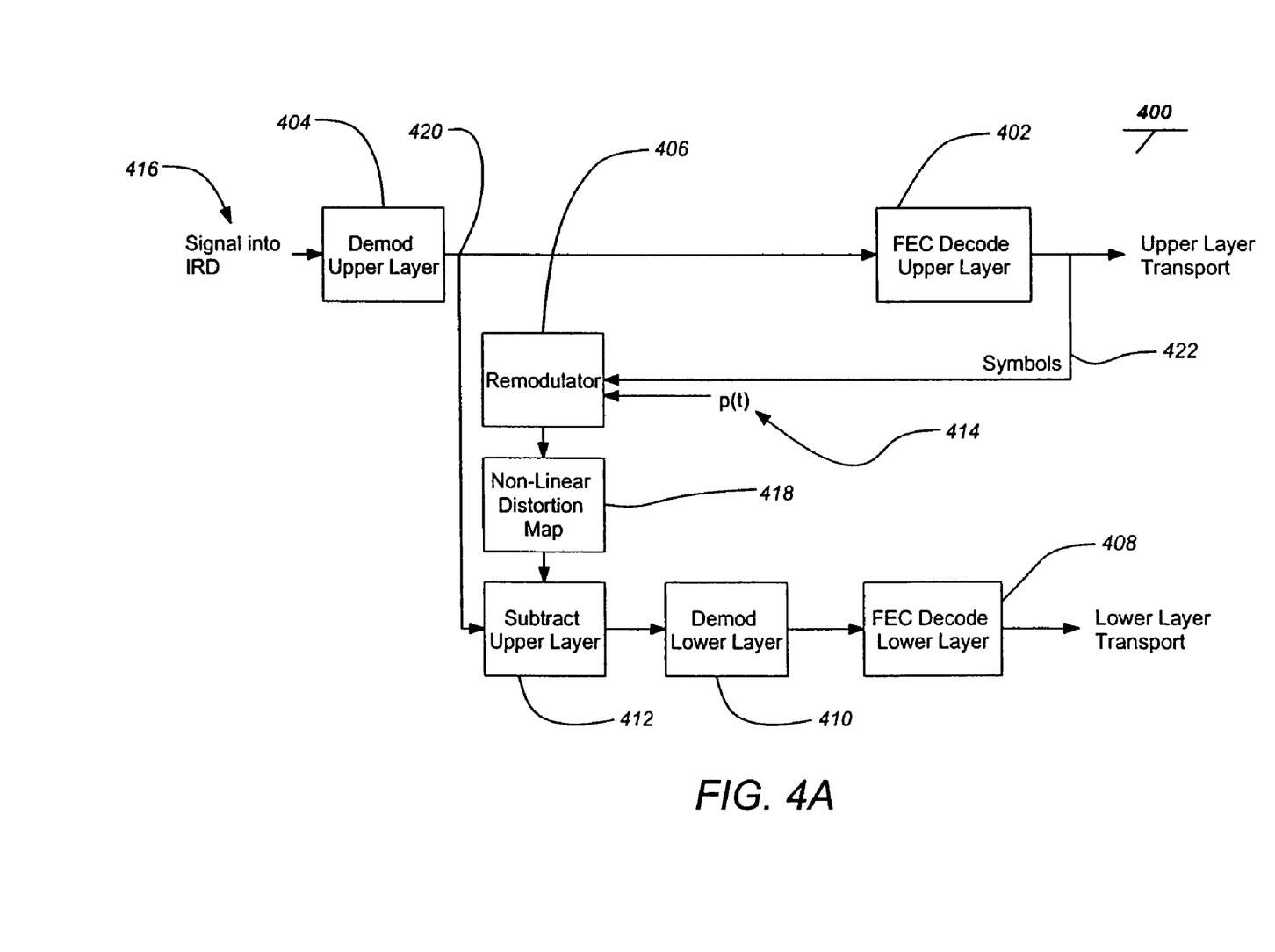
FIGS. 4A-4B are block diagrams for reception of first and second layered modulation by a typical receiver of the present invention.
Figure 4B:
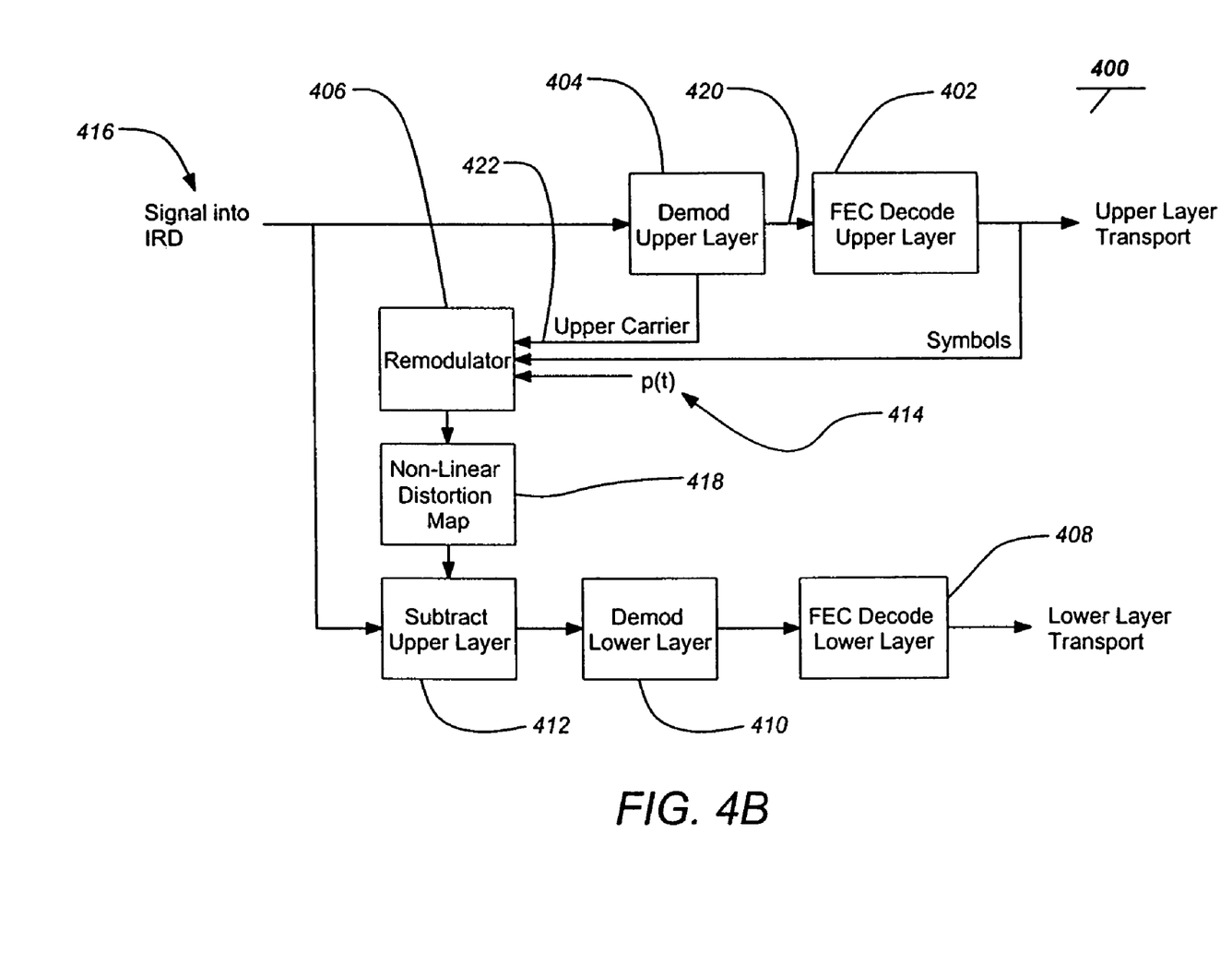

FIGS. 4A-4B are block diagrams for reception of a layered modulation signal by a typical receiver subsystem 400 of the present invention. FIG. 4A depicts reception where layer subtraction is performed on a signal where the upper carrier has been demodulated. The upper layer of the received combined signal 416, which may contain legacy modulation format, is processed by a demodulator 404 to produce the stable demodulated signal output 420. The demodulated signal is fed to a decoder 402 which FEC decodes the upper layer. The upper layer decoder 402 produces the upper layer symbols which are output to an upper layer transport and also used to generate an idealized upper layer signal. The upper layer symbols may be produced from the decoder 402 after Viterbi decode (BER<$10^{-3}$ or so) or after Reed-Solomon (RS) decode (BER<$10^{-9}$ or so), in typical decoding operations known to those skilled in the art. The upper layer symbols from the upper layer decoder 402 are fed to a remodulator 406 which effectively produces an idealized upper layer signal for subtraction from the stable demodulated signal 420.

In order for the subtraction to leave a clean small lower layer signal, the upper layer signal must be precisely reproduced. The modulated signal may have been distorted, for example, by TWTA non-linearity. The distortion effects are estimated from the received signal after the fact or from TWTA characteristics which may be downloaded into the IRD in AM-AM and/or AM-PM maps 418, used to eliminate the distortion.

A subtracter 412 then subtracts the idealized upper layer signal from the stable demodulated signal 420. This leaves the lower-power second layer signal. The subtracter includes a buffer or delay function to retain the stable demodulated signal 420 while the idealized upper layer signal is being constructed. The second layer signal is demodulated 410 and FEC decoded 408 according to its signal format.

FIG. 4B depicts reception where alternately layer subtraction is performed on the received layered signal. In this case, the demodulator 404 produces the upper carrier signal 422 (as well as the stable demodulated signal output 420). The upper carrier signal is output to the remodulator 406, which effectively produces an idealized upper layer signal which includes the upper layer carrier for subtraction from the received combined signal 416. Other equivalent methods of layer subtraction will occur to those skilled in the art and the present invention should not be limited to the examples provided here. Furthermore, those skilled in the art will understand that the present invention is not limited to two layers; additional layers may be included. Idealized upper layers are produced through remodulation from their respective layer symbols and subtracted. Subtraction may be performed on either the received combined signal or a demodulated signal. Finally, it is not necessary for all signal layers to be digital transmissions; the lowest layer may be an analog transmission.

The following analysis describes the exemplary two layer demodulation and decoding. It will be apparent to those skilled in the art that additional layers may be demodulated and decoded in a similar manner. The incoming combined signal is represented as:

$$s_{UL}(t) = f_U \left( M_U \exp(j\omega_U t + \theta_U) \sum_{m=-\infty}^{\infty} S_{Um} p(t - mT) \right) +$$

$$f_L \left( M_L \exp(j\omega_L t + \theta_L) \sum_{m=-\infty}^{\infty} S_{Lm} p(t - mT + \Delta T_m) \right) + n(t)$$

where, $M_U$ is the magnitude of the upper layer QPSK signal and $M_L$ is the magnitude of the lower layer QPSK signal and $M_L \ll M_U$. The signal frequencies and phase for the upper and lower layer signals are respectively $\omega_U$, $\theta_U$ and $\omega_U$, $\theta_U$. The symbol timing misalignment between the upper and lower layers is $\Delta T_m$. $p(t-mT)$ represents the time shifted version of the pulse shaping filter $p(t)$ 414 employed in signal modulation. QPSK symbols $S_{Um}$ and $S_{Lm}$ are elements of $$\left\{ \exp\left(j\frac{n\pi}{2}\right), n = 0, 1, 2, 3 \right\}.$$

$f_U(\cdot)$ and $f_L(\cdot)$ denote the distortion function of the TWTAs for the respective signals.

Ignoring $f_U(\cdot)$ and $f_L(\cdot)$ and noise $n(t)$, the following represents the output of the demodulator 404 to the FEC decoder 402 after removing the upper carrier:

$$s'_{UL}(t) = M_U \sum_{m=-\infty}^{\infty} S_{Um} p(t - mT) +$$

$$M_L \exp\{j(\omega_L - \omega_U)t + \theta_L - \theta_U\} \sum_{m=-\infty}^{\infty} S_{Lm} p(t - mT + \Delta T_m)$$

Because of the magnitude difference between $M_U$ and $M_L$, the upper layer decoder 402 disregards the $M_L$ component of the $s'_{UL}(t)$.

After subtracting the upper layer from $s_{UL}(t)$ in the subtracter 412, the following remains:

$$s_L(t) = M_L \exp\{j(\omega_L - \omega_U)t + \theta_L - \theta_U\} \sum_{m=-\infty}^{\infty} S_{Lm} p(t - mT + \Delta T_m)$$

Any distortion effects, such as TWTA nonlinearity effects are estimated for signal subtraction. In a typical embodiment of the present invention, the upper and lower layer frequencies are substantially equal. Significant improvements in system efficiency can be obtained by using a frequency offset between layers.

Using the present invention, two-layered backward compatible modulation with QPSK doubles a current 6/7 rate capacity by adding a TWTA approximately 6.2 dB above an existing TWTA power. New QPSK signals may be transmitted from a separate transmitter, from a different satellite for example. In addition, there is no need for linear travelling wave tube amplifiers (TWTAs) as with 16QAM. Also, no phase error penalty is imposed on higher order modulations such as 8PSK and 16QAM.

Backward Compatible Applications

Figure 5A:
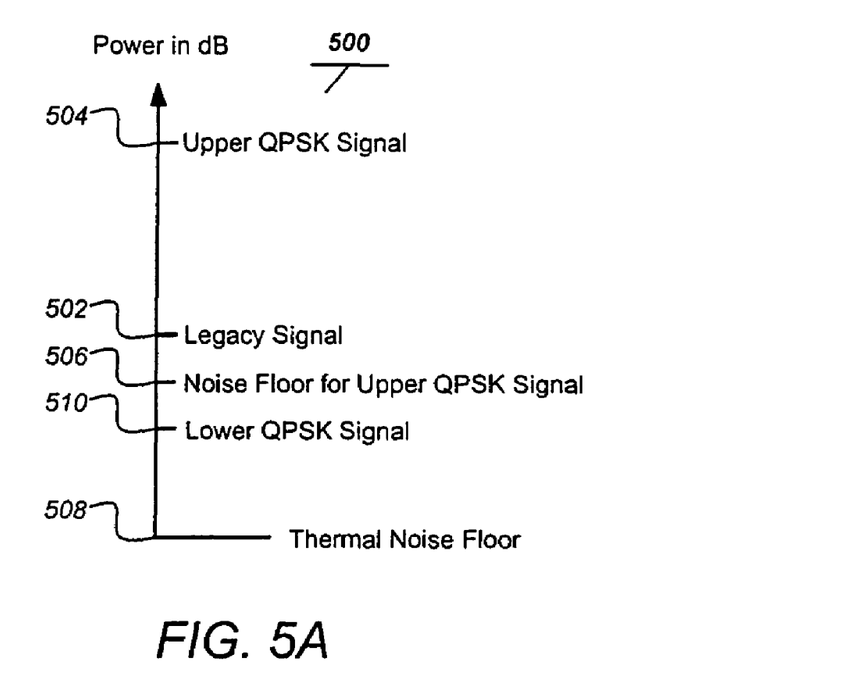
FIGS. 5A-5B depict the power levels for example embodiments of the present invention.

FIG. 5A depicts the relative power levels 500 of example embodiments of the present invention. FIG. 5A is not a scale drawing. This embodiment doubles the pre-existing rate 6/7 capacity by using a TWTA 6.2 dB above a pre-existing TWTA equivalent isotropic radiated power (EIRP) and second TWTA 2 dB below the pre-existing TWTA power. This embodiment uses upper and lower QPSK layers which are non-coherent. A code rate of 6/7 is also used for both layers. In this embodiment, the signal of the legacy QPSK signal 502 is used to generate the upper layer 504 and a new QPSK layer is the lower layer 510. The CNR of the legacy QPSK signal 502 is approximately 7 dB. In the present invention, the legacy QPSK signal 502 is boosted in power by approximately 6.2 dB bringing the new power level to approximately 13.2 dB as the upper layer 504. The noise floor 506 of the upper layer is approximately 6.2 dB. The new lower QPSK layer 510 has a CNR of approximately 5 dB. The total signal and noise of the lower layer is kept at or below the tolerable noise floor 506 of the upper layer. The power boosted upper layer 504 of the present invention is also very robust, making it resistant to rain fade. It should be noted that the invention may be extended to multiple layers with mixed modulations, coding and code rates.

In an alternate embodiment of this backwards compatible application, a code rate of 2/3 may be used for both the upper and lower layers 504, 510. In this case, the CNR of the legacy QPSK signal 502 (with a code rate of 2/3) is approximately 5.8 dB. The legacy signal 502 is boosted by approximately 5.3 dB to approximately 11.1 dB (4.1 dB above the legacy QPSK signal 502 with a code rate of 2/3) to form the upper QPSK layer 504. The new lower QPSK layer 510 has a CNR of approximately 3.8 dB. The total signal and noise of the lower layer 510 is kept at or below approximately 5.3 dB, the tolerable noise floor 506 of the upper QPSK layer. In this case, overall capacity is improved by 1.55 and the effective rate for legacy IRDs will be 7/9 of that before implementing the layered modulation.

In a further embodiment of a backwards compatible application of the present invention the code rates between the upper and lower layers 504, 510 may be mixed. For example, the legacy QPSK signal 502 may be boosted by approximately 5.3 dB to approximately 12.3 dB with the code rate unchanged at 6/7 to create the upper QPSK layer 504. The new lower QPSK layer 510 may use a code rate of 2/3 with a CNR of approximately 3.8 dB. In this case, the total capacity relative to the legacy signal 502 is approximately 1.78. In addition, the legacy IRDs will suffer no rate decrease.

Non-Backward Compatible Applications

As previously discussed the present invention may also be used in "non-backward compatible" applications. In a first example embodiment, two QPSK layers 504, 510 are used each at a code rate of 2/3. The upper QPSK layer 504 has a CNR of approximately 4.1 dB above its noise floor 506 and the lower QPSK layer 510 also has a CNR of approximately 4.1 dB. The total code and noise level of the lower QPSK layer 510 is approximately 5.5 dB. The total CNR for the upper QPSK signal 504 is approximately 9.4 dB, merely 2.4 dB above the legacy QPSK signal rate 6/7. The capacity is approximately 1.74 compared to the legacy rate 6/7.

Figure 5B:
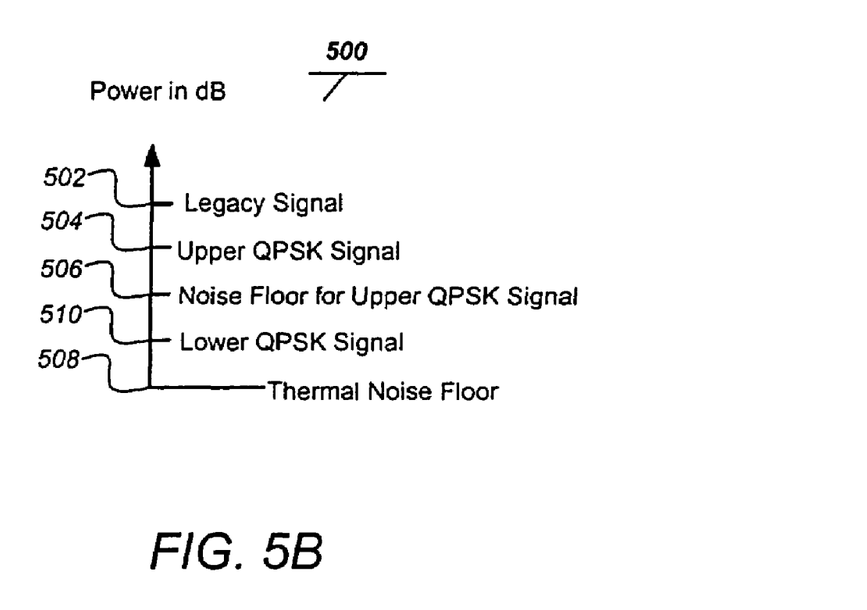

FIG. 5B depicts the relative power levels of an alternate embodiment wherein both the upper and lower layers 504, 510 are below the legacy signal level 502. The two QPSK layers 504, 510 use a code rate of 1/2. In this case, the upper QPSK layer 504 is approximately 2.0 dB above its noise floor 506 of approximately 4.1 dB. The lower QPSK layer has a CNR of approximately 2.0 dB and a total code and noise level at or below 4.1 dB. The capacity of this embodiment is approximately 1.31 compared to the legacy rate 6/7.

CONCLUSION

The foregoing description including the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the invention. Since many embodiments of the invention can be made without departing from the scope of the invention, the invention resides in the claims hereinafter appended.

What is claimed is:

1. A method of transmitting a transmission signal having a legacy upper layer signal and a lower layer signal non-coherently added to the legacy upper layer signal, the method comprising:
   transmitting the legacy upper layer signal including a first carrier and first signal symbols; and
   transmitting a lower layer signal including a second carrier and second signal symbols;
   wherein a plurality of legacy receivers demodulate the legacy upper layer signal to produce the first signal symbols and do not demodulate the lower layer signal to produce the second signal symbols; and
   wherein a plurality of layered modulation receivers demodulate the legacy upper layer signal to produce the first signal symbols, remodulate the first signal symbols, and subtract the remodulated first signal symbols from the demodulated legacy upper layer signal to produce the second signal symbols.

2. The method of claim 1, wherein at least one of the legacy upper layer signal and the lower layer signal are quadrature phase shift keyed (QPSK).

3. The method of claim 1, wherein a code rate for at least one of the legacy upper layer signal and lower layer signal is 6/7.

4. The method of claim 1, wherein a code rate for at least one of the legacy upper layer signal and lower layer signal is 2/3.

5. The method of claim 1, wherein a code rate for at least one of the legacy upper layer signal and lower layer signal is 1/2.

6. The method of claim 1, wherein the lower layer signal is generated by power boosting a legacy signal.

7. The method of claim 1, wherein a total code and noise level of the legacy upper layer signal is no greater than a noise floor of the second signal layer.

8. The method of claim 1, wherein at least one of the legacy upper layer signal and lower layer signal is coded using a turbo code.

9. The method of claim 1, wherein both the legacy upper layer signal and lower layer signal are coded using a single turbo code.

10. A receiver system for compatibly receiving a transmission signal having a legacy upper layer signal and a lower layer signal non-coherently added to the legacy upper layer signal, the system comprising:
- a plurality of layered modulation receivers, each comprising;
  - a first demodulator for demodulating the legacy upper layer signal to produce a demodulated signal;
  - a first layer decoder, coupled to the first layer demodulator, for decoding the demodulated signal to produce legacy upper layer signal symbols;
  - a remodulator, coupled to the first layer decoder, for remodulating the first signal symbols to produce a remodulated legacy upper layer signal;
  - a subtracter, coupled to the first demodulator and the remodulator, for subtracting the remodulated legacy upper layer signal from the demodulated signal to produce the lower layer signal;
  - a second layer demodulator, coupled to the subtracter, the second layer demodulator for demodulating the lower layer signal to produce a second demodulator output; and
  - a second layer decoder, coupled to the second layer demodulater, the second layer decoder for decoding the second layer demodulated output to produce lower layer signal symbols;
- a plurality of legacy receivers, each configured to demodulate the legacy upper layer signal and not the lower layer signal, and each comprising:
  - a legacy receiver demodulator configured to demodulate the legacy upper layer signal to produce a second demodulated signal; and
  - a legacy receiver decoder, coupled to the legacy receiver demodulator, configured to decode the second demodulated signal to produce legacy upper layer symbols.

11. The receiver system of claim 10, further comprising a non-linear distortion map for removing non-linear distortion effects from the remodulated legacy upper layer signal.

12. The receiver system of claim 10, wherein the legacy upper layer signal is a boosted legacy signal.

13. The receiver system of claim 10, wherein at least one of the legacy upper layer signal and lower layer signal are quadrature phase shift keyed (QPSK).

14. The receiver system of claim 10, wherein a code rate for at least one of the legacy upper layer signal and lower layer signal is 6/7.

15. The receiver system of claim 10, wherein a code rate for at least one of the legacy upper layer signal and lower layer signal is 2/3.

16. The receiver system of claim 10, wherein a code rate for at least one of the legacy upper layer signal and lower layer signal is 1/2.

17. The receiver system of claim 10, wherein the second signal layer is generated by power boosting the legacy upper layer signal.

18. The receiver system of claim 10, wherein a total code and noise level of the legacy upper layer signal is no greater than a noise foor of the lower layer signal.

19. The receiver system of claim 10, wherein at least one of the legacy upper layer signal and lower layer signal is coded using a turbo code.

20. The receiver system of claim 10, wherein both the legacy upper layer signal and lower layer signal are coded using a single turbo code.

21. The receiver system of claim 10, wherein the legacy upper layer signal and lower layer signal each have a carrier frequency that is substantially similar.

22. The receiver system of claim 10, wherein a carrier frequency of the legacy upper layer signal and a second carrier frequency of the lower layer signal are offset in frequency.

23. The receiver system of claim 10, wherein the first layer decoder comprises a Viterbi decoder.

24. The receiver system of claim 10, wherein the first layer decoder comprises a Reed-Solomon decoder.

* * * * *